(12) United States Patent
Suzuki

(10) Patent No.: US 7,853,838 B2
(45) Date of Patent: Dec. 14, 2010

(54) METHOD AND APPARATUS FOR HANDLING FAILURE IN ADDRESS LINE

(75) Inventor: Kenji Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/453,007

(22) Filed: Apr. 27, 2009

(65) Prior Publication Data
US 2009/0276659 A1 Nov. 5, 2009

Related U.S. Application Data

(63) Continuation of application No. PCT/JP2006/321566, filed on Oct. 27, 2006.

(51) Int. Cl.
*G11C 29/00* (2006.01)
(52) U.S. Cl. .................. 714/710; 714/718; 365/201
(58) Field of Classification Search ............ None
See application file for complete search history.

(56) References Cited

U.S. PATENT DOCUMENTS

| | | | | |
|---|---|---|---|---|
| 4,890,224 A * | 12/1989 | Fremont | ............... | 710/11 |
| 4,937,790 A * | 6/1990 | Sasaki et al. | ............ | 365/230.01 |
| 5,119,488 A * | 6/1992 | Takamatsu et al. | ............ | 714/4 |
| 5,463,643 A * | 10/1995 | Gaskins et al. | ............ | 714/766 |
| 6,185,708 B1 * | 2/2001 | Sugamori | ............ | 714/724 |
| 6,574,757 B1 * | 6/2003 | Park et al. | ............ | 714/710 |
| 6,809,972 B2 * | 10/2004 | Lehmann et al. | ............ | 365/200 |
| 6,993,690 B1 * | 1/2006 | Okamoto | ............ | 714/718 |
| 7,380,161 B2 * | 5/2008 | Cordero et al. | ............ | 714/8 |
| 2004/0025095 A1 * | 2/2004 | Nemani et al. | ............ | 714/710 |
| 2006/0023556 A1 * | 2/2006 | Versen et al. | ............ | 365/230.03 |
| 2007/0113209 A1 * | 5/2007 | Park et al. | ............ | 716/4 |
| 2007/0147154 A1 * | 6/2007 | Lee | ............ | 365/222 |
| 2008/0215929 A1 * | 9/2008 | Cordero et al. | ............ | 714/52 |

FOREIGN PATENT DOCUMENTS

| | | |
|---|---|---|
| JP | 55-28565 | 2/1980 |
| JP | 57-64395 | 4/1982 |
| JP | 57-69599 | 4/1982 |
| JP | 59-36394 | 2/1984 |

OTHER PUBLICATIONS

International Search Report issued Jan. 16, 2007 in corresponding International Patent Application PCT/JP2006/321566.

* cited by examiner

*Primary Examiner*—Jeffrey A Gaffin
*Assistant Examiner*—Guerrier Merant
(74) *Attorney, Agent, or Firm*—Fujitsu Patent Center

(57) ABSTRACT

An address line failure handling apparatus includes a failed address line specifying unit that examines the address line connected to each bit and specifies a failed address line, an address line substituting unit in which an upper address line connected to an upper bit of the memory is connected with a branch address line branched off from a lower address line connected to a lower bit other than the upper bit, and that switches between an input from the upper address line and an input from the branch address line, and outputs any of the inputs to the upper bit, and an address line substitution instructing unit that instructs the address line substituting unit to switch from the upper address line to the branch address line branched off from the failed address line when the failed address line is specified.

8 Claims, 7 Drawing Sheets

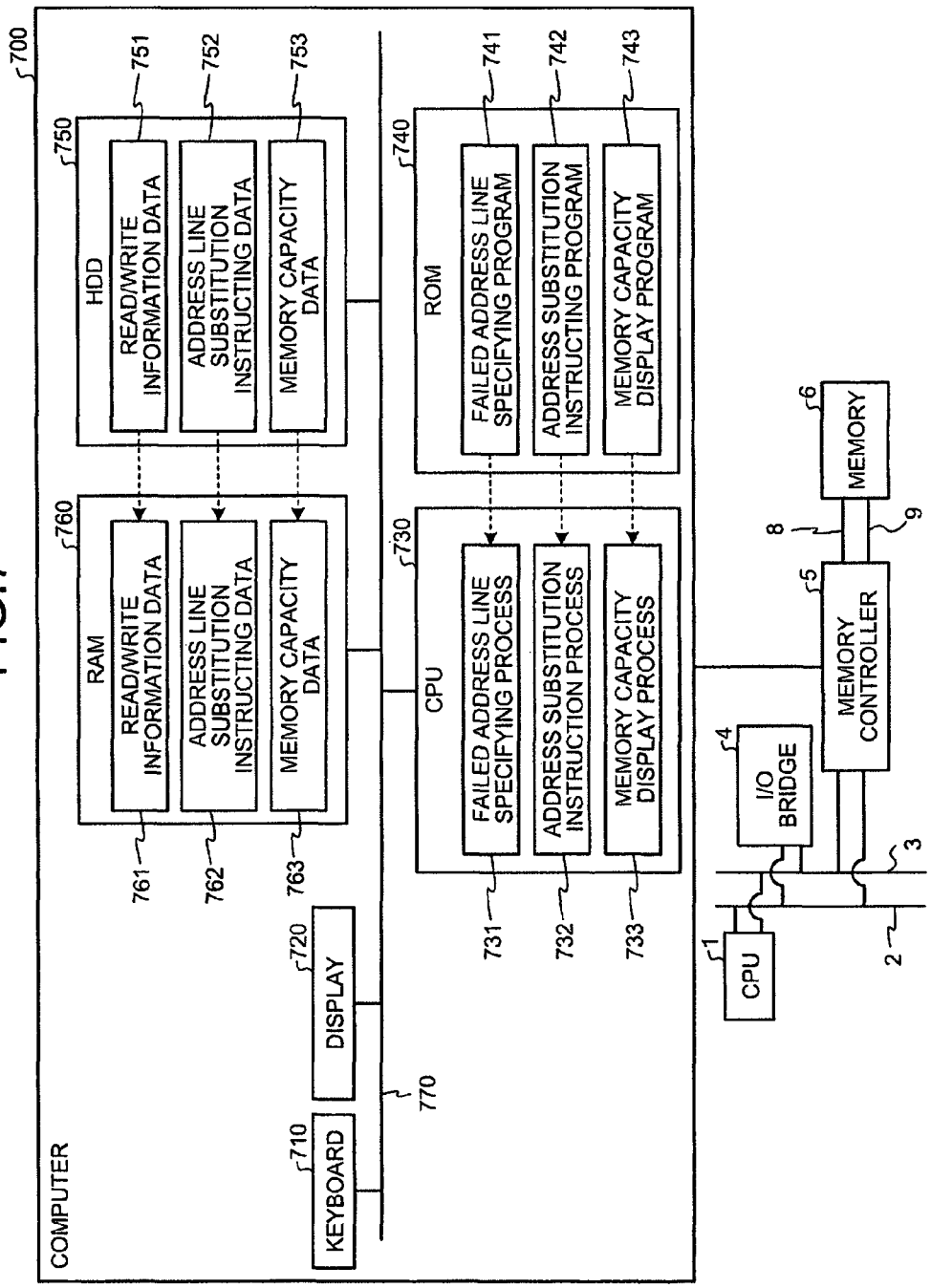

METHOD AND APPARATUS FOR HANDLING FAILURE IN ADDRESS LINE

CROSS-REFERENCE TO RELATED APPLICATION

This application is a continuation of PCT international application Ser. No. PCT/JP2006/321566 filed on Oct. 27, 2006 which designates the United States, incorporated herein by reference.

FIELD

The embodiments discussed herein are directed to an address line failure handling apparatus, an address line failure handling method, an address line failure handling program, an information processing device, and a memory controller.

BACKGROUND

In a conventional computer system, a memory controller is provided between a central processing unit (CPU) and a memory, and between an I/O bridge and the memory. A system address bus and a system data bus connect the CPU and the memory controller, and the I/O bridge and the memory controller. A memory address bus and a memory data bus connect the memory controller and the memory. When a failure occurs in the memory connected through the memory controller and the address line in the computer system, various methods can be performed to handle such a failure. Generally, when a failure occurs in a large-capacity memory in a server, the memory in which the failure occurs is isolated (memory degeneration), and the system is reactivated with other memories.

A memory failure includes that of a memory cell (memory element) mounted in the memory, and that of an address line connected to the memory. According to one known method, when permanent fault occurs in a memory cell, data is corrected according to ECC (Error Correcting Code) to avoid memory degeneration. According to another known method as that described in Japanese Laid-open Patent Publication No. 59-036394, when fixed data is written into a memory and failure occurs in one cell so that read-out data can only be "4", address lines are switched so that the data written into the failed cell becomes "4". Thus, the permanent fault of the memory cell can be avoided.

Other than that, Japanese Laid-open Patent Publication No. 55-028565 discloses a memory system that relieves a memory failure by mounting an auxiliary memory that substitutes a main memory. In this case, it becomes possible to avoid main memory degeneration because a memory failure is handled by switching an address line to the auxiliary memory both when a failure occurs in the memory cell of the main memory, and when a failure occurs in the address line of the main memory.

A problem occurs in the conventional technique of degenerating a failed memory in that, because the system is reactivated after memory degeneration, sometimes memory capacity becomes insufficient due to a significant decrease in memory capacity, and the system may not be able to be activated.

Another problem occurs in the conventional technique of avoiding permanent fault of a memory cell in that, although the processing for avoiding memory degeneration can be performed when a memory cell is failed, memory degeneration cannot be avoided when an address line is failed. In other words, a problem occurs in the conventional technique in that although memory degeneration can be avoided by correcting data or by switching address lines when a memory cell permanent fault occurs, a memory address line failure cannot be handled, and necessitating memory degeneration and system reactivation.

A problem occurs in the conventional technique of mounting an auxiliary memory in that memory degeneration can be avoided only if the auxiliary memory is mounted when a failure occurs in a memory cell of a main memory and when a failure occurs in an address line of the main memory, the cost of mounting the auxiliary memory increases, and memory degeneration cannot be avoided simply.

As can be seen, a problem occurs in all of the conventional techniques in that a significant decrease in memory capacity occurs due to memory degeneration when a failure occurs in a memory address line.

SUMMARY

According to an aspect of the invention, an address line failure handling apparatus handles a failure of an address line connected to each bit of a memory, and the address line failure handling apparatus includes a failed address line specifying unit that examines the address line connected to each bit and specifies a failed address line, an address line substituting unit in which an upper address line connected to an upper bit of the memory is connected with a branch address line branched off from a lower address line connected to a lower bit other than the upper bit, and that switches between an input from the upper address line and an input from the branch address line, and outputs any of the inputs to the upper bit, and an address line substitution instructing unit that instructs the address line substituting unit to switch from the upper address line to the branch address line branched off from the failed address line when the failed address line specifying unit specifies the failed address line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a figure for illustrating a computer that executes an address line failure handling program according to the first embodiment.

DESCRIPTION OF EMBODIMENTS

Embodiments of an address line failure handling apparatus, an address line failure handling method, an address line failure handling program, an information processing device, and a memory controller according to the present invention will be explained in detail with reference to the attached figures. In the following, a configuration and a processing procedure of an address line failure handling apparatus according to a first embodiment, and effects of the first embodiment will be explained in this order, and then the address line failure handling apparatus according to a second embodiment, and the address line failure handling apparatus according to a third embodiment are explained in this order similarly to the first embodiment.

[a] First Embodiment

First of all, principal terms used in the present embodiments will be explained. An "MMB (Management board)" used in the following embodiments means a device that monitors a state of a hardware such as a CPU and a memory, manages operations performed by a computer system such as control of a hardware configuration, default of the hardware, and collection of CPU error information, and corresponds to a "memory controller controlling device" described in claims. A "memory controller" is an interface between the memory and the CPU, or the memory and an I/O bridge, and performs control such as reading and writing of data from and into the memory, and refreshing of the memory following an order from the CPU or the I/O bridge via a system bus.

Figure 1:
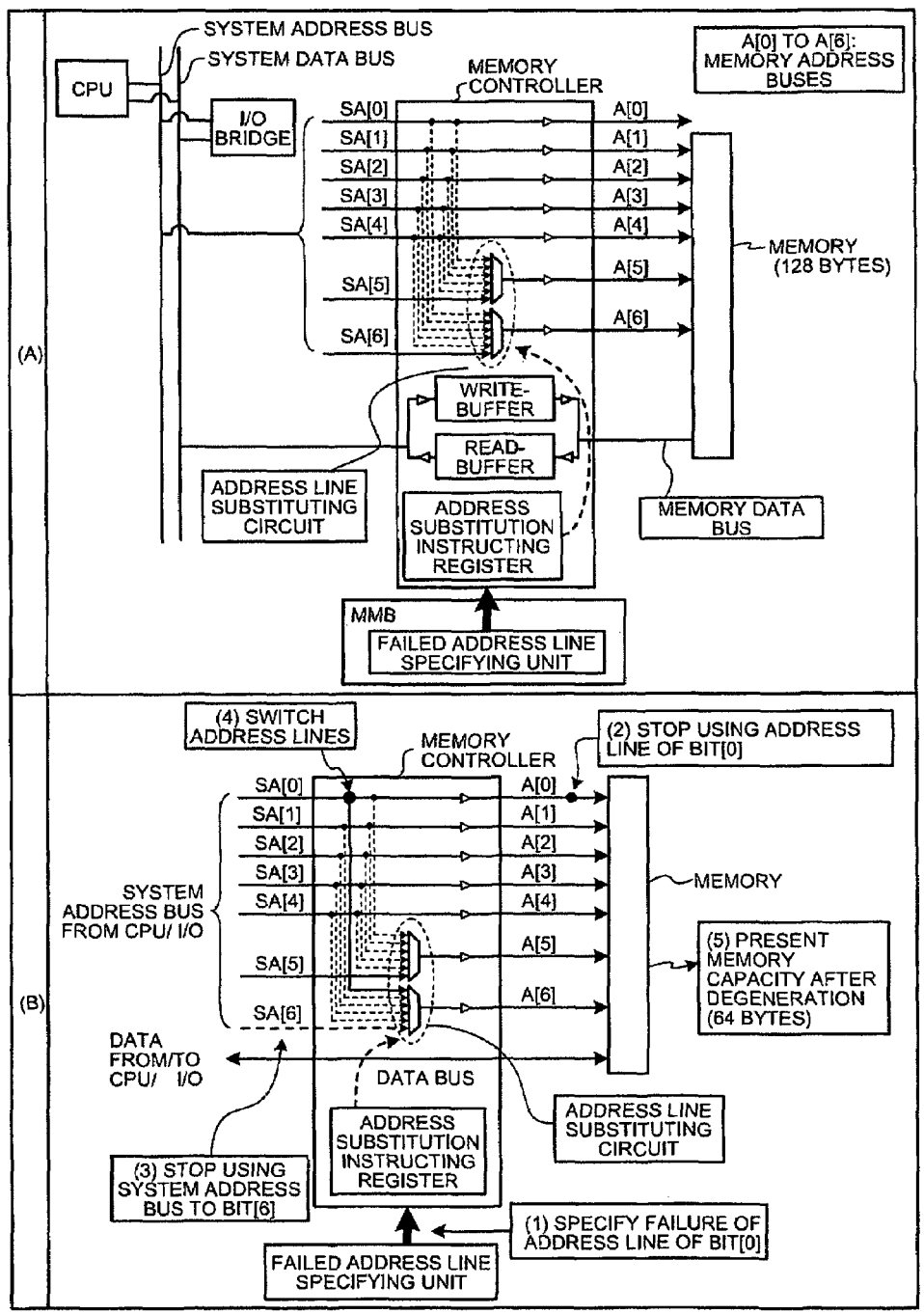
FIG. 1 is a figure for explaining an overview and characteristics of an address line failure handling apparatus according to a first embodiment.

Next, principal characteristics of the address line failure handling apparatus according to the first embodiment will be explained specifically using FIG. 1. FIG. 1 is a figure for explaining an overview and characteristics of the address line failure handling apparatus according to the first embodiment.

The address line failure handling apparatus according to the first embodiment is installed in a computer system as depicted in (A) of FIG. 1. In other words, in the computer system, there is a memory controller between a CPU and a memory, and between an I/O bridge and the memory; system address buses (SA[0] to SA[6]) and system data buses connect the CPU and the memory controller, and the I/O bridge and the memory controller; memory address buses (address line: A[0] to A[6]) and memory data buses connect the memory controller and the memory; and an MMB that manages the hardwires is installed. The memory controller controls the memory through the memory data bus and the memory address bus following an order from the CPU or the I/O bridge transmitted through the system address bus and the system data bus. For example, the memory controller writes data into the memory according to write-data stored in a write-buffer, reads the data from the memory, and stores the data in a read-buffer.

In the thus-configured computer system, the overview of the address line failure handling apparatus according to the first embodiment is that the address line failure handling apparatus handles a failure of seven address lines (A[0] to A[6]) connected to the memory of 128 bytes, and the address line failure handling apparatus has the principal characteristic of making it possible to avoid a significant decrease in the memory capacity due to memory degeneration even when a failure occurs in an address line of the memory.

The principal characteristic is briefly explained. In the address line failure handling apparatus according to the first embodiment, a branch address line branched off from a lower address line connected to a lower bit of the memory is connected to an upper address line connected to an upper bit other than the lower bit, and an address line substituting circuit that switches an input from the upper address line and an input from the branch address line, and outputs any of the inputs to the upper bit is installed.

Specifically, in the case depicted in (A) of FIG. 1, the branch address line branched off from the address lines connected to a bit[0] to a bit[4] that are lower bits are connected to the address lines connected to a bit[5] and a bit[6] that are upper bits (see the arrow of a dotted line depicted in (A) of FIG. 1). The address line substituting circuit that switches between an input from the system address bus SA[5] to the bit[5], and any of the inputs from the branch address lines from the system address buses SA[0] to SA[4], and outputs any of the inputs to the address line bit [5], and the address line substituting circuit that switches between an input from the system address bus SA[6] to the bit[6], and any of the inputs from the branch address lines from the system address bus SA[0] to SA[4], and outputs any of the inputs to the address line bit[6] are installed.

In the configuration, the address line failure handling apparatus according to the first embodiment examines an address line connected to each bit, and specifies a failed address line. In other words, the address line failure handling apparatus according to the first embodiment examines seven address lines (A[0] to A[6]) connected to the memory of 128 bytes depicted in (A) of FIG. 1, and specifies a failed address line. More specifically, when the computer system is turned on, a failed address line specifying unit installed in the MMB depicted in (A) of FIG. 1 examines all the address lines, and specifies a failed address line.

When a failed address line is specified, the address line failure handling apparatus according to the first embodiment instructs the address line substituting circuit to switch from an upper address line to a branch address line branched off from the failed address line. In the present embodiment, when a failed address line is specified, the address line substituting circuit is first instructed to switch from the address line bit[6] to a branch address line branched off from the failed address line, and when a plurality of failed address lines are specified, the address line substituting circuit is instructed to switch the address line bit[6], the address line bit[5], and so on, in this order.

More specifically, as depicted in (B) of FIG. 1, for example, when the failed address line specifying unit installed in the address line failure handling apparatus according to the first embodiment specifies a failure of the address line bit[0] (see (B)(1) of FIG. 1), the address line failure handling apparatus according to the first embodiment, following the instruction stored in an address substitution instructing register described later, stops using the address line bit[0] (see (B)(2) of FIG. 1) and using the system address bus SA[6] to the bit[6] (see (B)(3) of FIG. 1), and switches from the input from the system address bus SA[6] to the bit[6] to the input from the branch address line of the system address bus SA[0] to output the latter to the address line bit[6] (see (B)(4) of FIG. 1).

When the address line failure handling apparatus according to the first embodiment switches from the upper address line to the branch address line branched off from the failed address line, the address line failure handling apparatus calculates the remaining memory capacity, and displays the remaining capacity on the CPU and the management board (see (B)(5) of FIG. 1). In other words, as depicted in (B) of FIG. 1, when the address line failure handling apparatus switches from the input from the address line bit [6] to the input from the branch address line of the system address bus SA[0] to output the latter to the address line bit[6], the address line failure handling apparatus calculates the remaining memory capacity to be 64 bytes, and displays the remaining memory capacity on the CPU and the management board. In (B) of FIG. 1, the CPU, the I/O bridge, and the write-buffer depicted in (A) of FIG. 1 are omitted.

Therefore, the address line failure handling apparatus according to the first embodiment can continue using the memory by sacrificing the upper address line and substituting the upper address line with the lower address line. As in the above-described principal characteristic, it becomes possible to avoid a significant decrease in the memory capacity due to memory degeneration even when a failure occurs in an address line of the memory.

Figure 2:
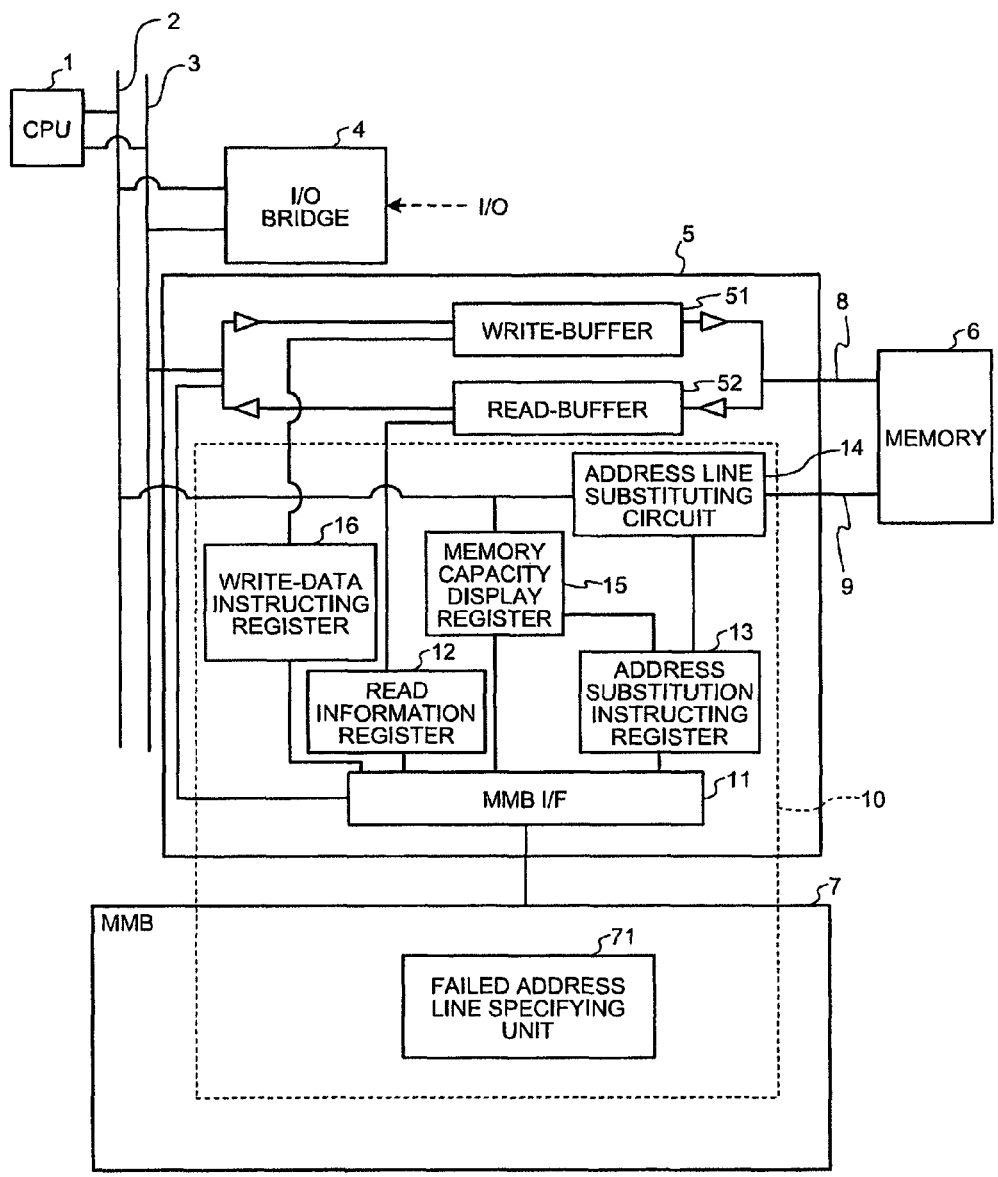
FIG. 2 is a block diagram for illustrating a configuration of the address line failure handling apparatus according to the first embodiment.
Figure 3:
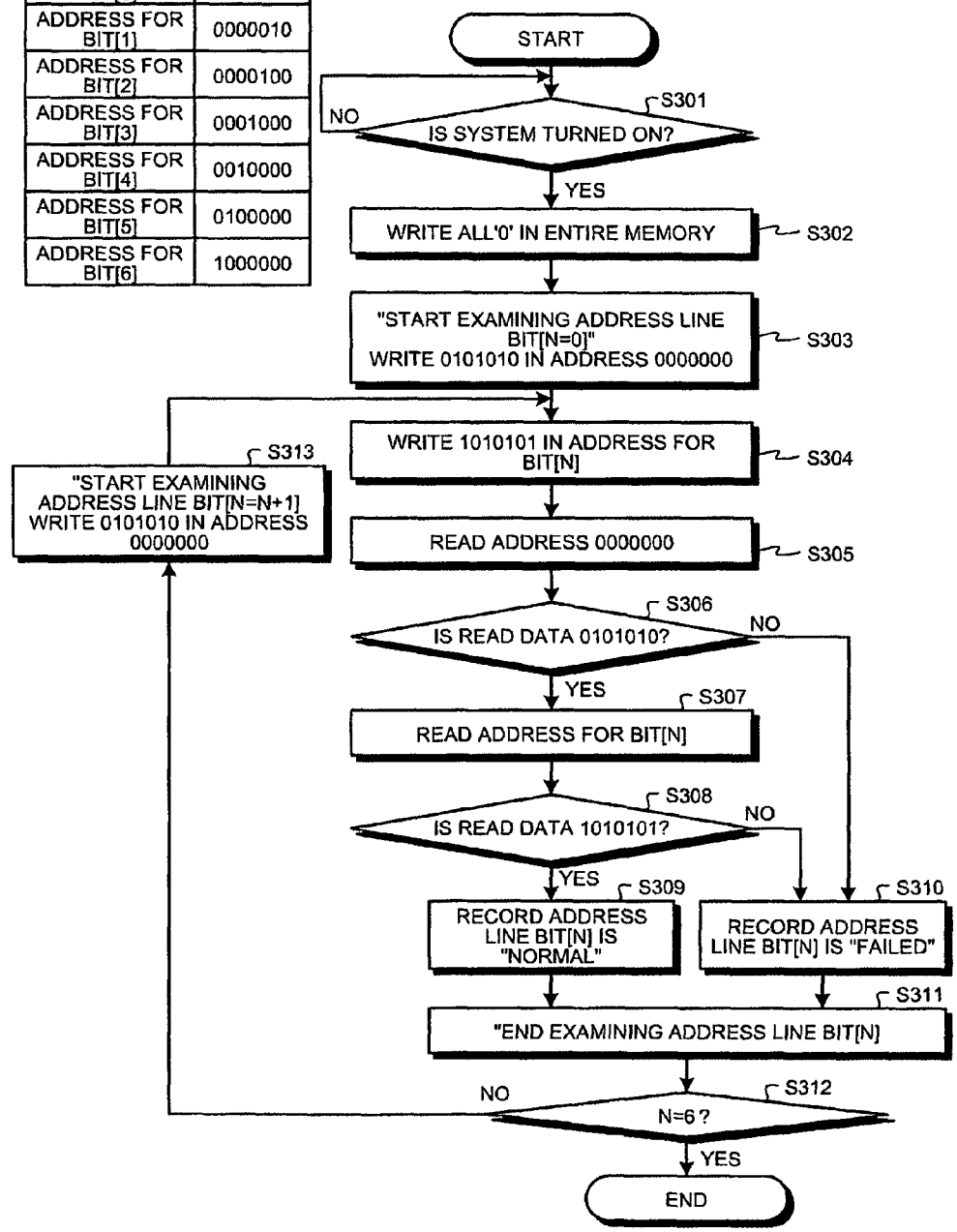
FIG. 3 is a figure for explaining a processing procedure of a failed address line specifying unit according to the first embodiment.
Figure 4:
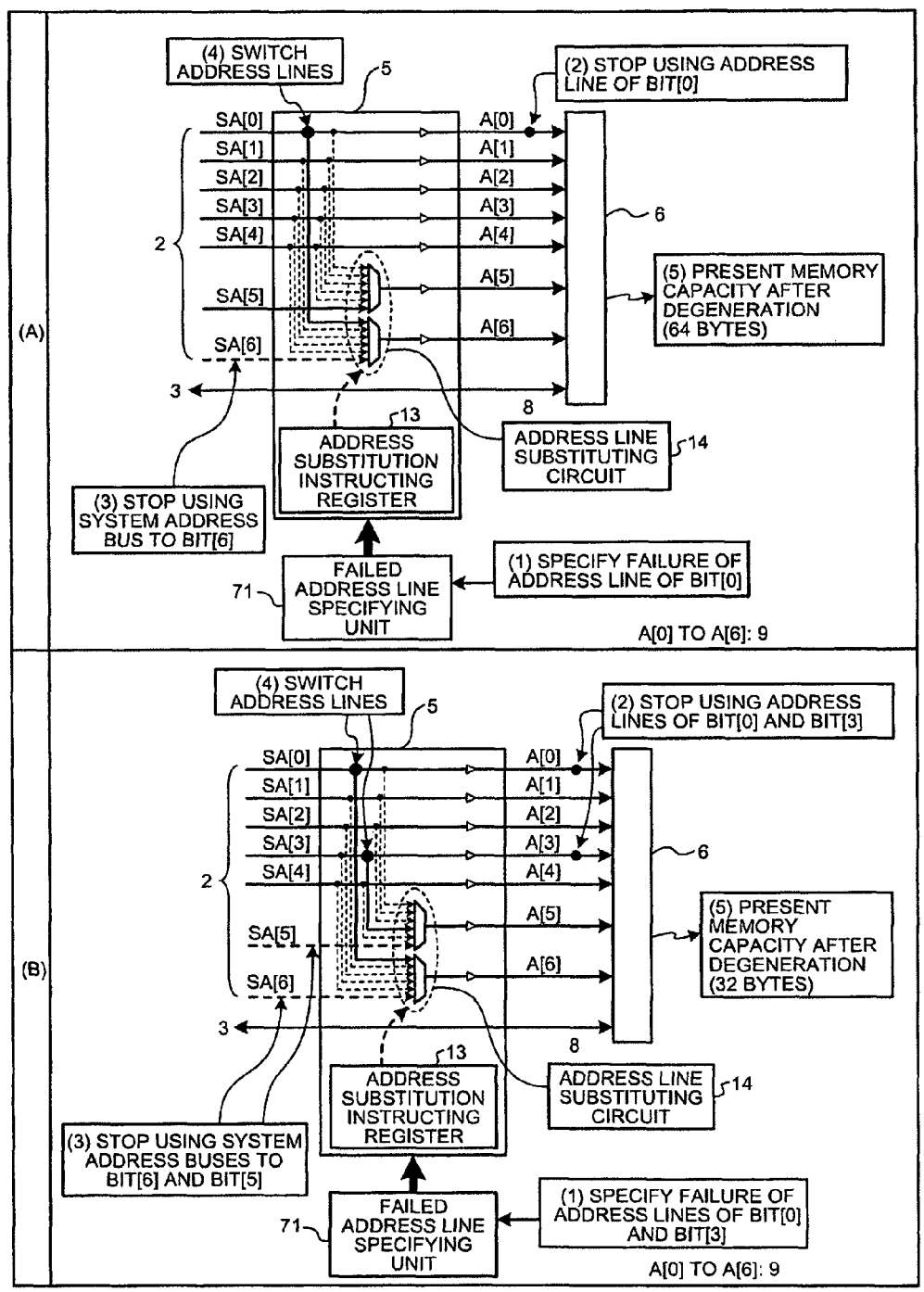
FIG. 4 is a figure for explaining an address line substituting circuit, an address substitution instructing register, and a memory capacity display register.

Next, the address line failure handling apparatus according to the first embodiment will be explained using FIGS. 2 to 4. FIG. 2 is a schematic for illustrating a configuration of the address line failure handling apparatus according to the first embodiment. FIG. 3 is a figure for explaining a processing of the failed address line specifying unit according to the first embodiment. FIG. 4 is a figure for explaining the address line substituting circuit, the address substitution instructing register, and the memory capacity display register.

As depicted in FIG. 2, a memory controller 5 includes an MMB I/F 11, a read information register 12, a write-data instructing register 16, an address substitution instructing register 13, an address line substituting circuit 14, a memory capacity display register 15, a write-buffer 51, and a read-buffer 52. An MMB 7 includes a failed address line specifying unit 71. The memory controller 5 is connected to a CPU 1, and an I/O bridge 4 through a system address bus 2, and a system data bus 3. Furthermore, the memory controller 5 is connected to a memory 6 through a memory data bus 8 and a memory address bus 9. The MMB 7 that manages the entire operation performed by the computer system manages the operation performed by the memory controller 5 through the MMB I/F 11.

As depicted in FIG. 2, an address line failure handling apparatus 10 according to the first embodiment is configured with, particularly as those closely related to the present invention, the MMB I/F 11, the read information register 12, the write-data instructing register 16, the address substitution instructing register 13, the address line substituting circuit 14, and the memory capacity display register 15 in the memory controller 5, and the failed address line specifying unit 71 in the MMB 7. The failed address line specifying unit 71 corresponds to a "failed address line specifying unit" described in the claims, the address line substituting circuit 14 corresponds similarly to an "address line substituting unit", the address substitution instructing register 13 corresponds to similarly an "address line substitution instructing unit", and the memory capacity display register 15 corresponds similarly to a "remaining memory capacity display unit".

The address line substituting circuit 14 is a circuit in which a branch address line branched off from a lower address line connected to a lower bit of the memory is connected to an upper address line connected to an upper bit other than the lower bit, and that switches an input from the upper address line and an input from the branch address line, and outputs any of the inputs to the upper bit.

Specifically, as depicted in FIG. 4, in the memory 6 of 128 bytes composed of 7 bits, branch address lines branched off from address lines connected to a bit[0] to a bit[4] that are lower bits are connected to address lines connected to a bit[5] to a bit[6] that are upper bits, and an address line substituting circuit that switches between an input from a system address bus SA[5] to the bit[5] and an input from any of the branch address lines from system address buses SA[0] to SA[4], and outputs any of the inputs to the address line bit [5], and an address line substituting circuit that switches between an input from a system address bus SA[6] to the bit[6] and an input from any of the branch address lines from system address buses SA[0] to SA[4], and outputs any of the inputs to the address line bit[6] are installed.

The failed address line specifying unit 71 examines an address line connected to each bit, and specifies a failed address line. In other words, the address line failure handling apparatus according to the first embodiment examines the seven address lines (A[0] to A[6]) connected to the memory of 128 bytes depicted in FIG. 4, and specifies a failed address line. Specifically, when the computer system is turned on, the failed address line specifying unit 71 installed in the MMB 7 examines all the address lines, and specifies a failed address line following the processing procedure of FIG. 3, for example.

As depicted in FIG. 3, when the computer system is turned on (Yes at Step S301), the failed address line specifying unit 71 writes all '0' in the entire memory 6 (Step S302), writes 0101010 in the address 0000000 to start examining the address line bit[0], that is A[0] (Step S303), and then writes 1010101 in the address for bit[0] (see the top table of FIG. 3) (Step S304). Then, the failed address line specifying unit 71 reads the data written in the address 0000000 (Step S305), and determines whether the read data matches 0101010 (Step S306). When they do not match with each other (No at Step S306), the address line bit[0], that is A[0] is determined to be failed, and the result is recorded (Step S310).

On the other hand, when the read data matches 0101010 (Yes at Step S306), the failed address line specifying unit 71 next reads the data written in the address 0000001 (Step S307), and determines whether the read data matches 1010101 (Step S308). When they do not match with each other (No at Step S308), the address line bit[0], that is A[0] is determined to be failed, and the result is recorded (Step S310).

On the other hand, when the read data matches 1010101 (Yes at Step S308), the address line bit[0], that is [A] is determined to be normal, and the result is recorded (Step S309). Then, the examination of the address line bit[0], that is A[0] has ended (Step S311). However, the examination of the address line bit[6], that is A[6] has not ended (No at Step S312). Subsequently, the failed address line specifying unit 71 writes 0101010 in the address 0000000 to start the examination of the address line bit [1], that is A[1] (Step S313), and then writes 1010101 in the address for the bit[1] (see the top table in FIG. 3) (Step S304). Subsequently, the same processing as that for A[0] (Step S305 to Step S310) is performed for A[1]. The series of the processing is repeated until the examination of the address line bit[6], that is A[6] ends, and when the examination of the A[6] ends (Yes at Step S312), the processing ends.

In other words, when the computer system is turned on (Yes at Step S301), the failed address line specifying unit 71 receives, through the MMB I/F 11, write-data stored in the write-data instructing register 16 through the write-buffer 51, and the read-data stored in the read information register 12 through the read-buffer 52, examines all the address lines, and specifies a failed address line by performing the all above-described processing, and instructs the address substitution instructing register 13 through the MMB I/F 11 to switch the specified failed address line. For example, as depicted in (A) of FIG. 4, when the failed address line specifying unit 71 specifies a failure of the address line bit[0], the failed address line specifying unit 71 instructs to stop using the address line bit[0] and stop using the system address bus SA[6] to the bit[6], and to output an input from the branch address line of the system address bus SA[0], in place of an input from the system address bus SA[6] to the bit [6], to the address line bit[6].

Returning to FIG. 2, when a failed address line is specified, the address substitution instructing register 13 instructs the address line substituting circuit to switch from an upper address line to a branch address line branched off from the failed address line following an instruction from the failed address line specifying unit 71. The address substitution instructing register 13 corresponds to an address line substitution instructing unit described in the claims. In the present embodiment, when a failed address line is specified, the address line substituting circuit is first instructed to switch from the address line bit[6] to a branch address line branched off from the failed address line, and when a plurality of failed address lines are specified, the address line substituting circuit is instructed to switch the address line bit[6], the address line bit[5], and so on, in this order.

More specifically, as depicted in (A) of FIG. 4, when the failed address line specifying unit 71 specifies a failure of the address line bit[0], for example, (see (A)(1) of FIG. 4), the address line substituting circuit 14 stops using the address line bit[0] (see (A)(2) of FIG. 4), stops using the system address bus SA[6] to the bit[6] (see (A)(3) of FIG. 4), and switches from an input from the system address bus SA[6] to the bit[6] to an input from the branch address line to the system address bus SA[0] to output the latter to the address line bit[6] (see (A)(4) of FIG. 4) following the instruction stored in the address substitution instructing register 13 through the MMB I/F 11.

As depicted in (B) of FIG. 4, when the failed address line specifying unit 71 specifies a failure of the address line bit[0], and the address line bit[3] (see (B)(1) of FIG. 4), the address line substituting circuit 14 stops using the address line bit[0], and the address line bit[3] (see (B)(2) of FIG. 4), stops using the system address bus SA[6] to the bit[6], and the system address bus SA[5] to the bit [5] (see (B)(3) of FIG. 4), switches from an input from the system address bus SA[6] to the bit[6] to an input from the branch address line to the system address bus SA[0] to output the latter to the address line bit [6], and switches from the input from the system address bus SA[5] to the bit [5] to an input from the branch address line to the system address bus SA[3] to output the latter to the address line bit [5] (see (B)(4) of FIG. 4) following an instruction stored in the address substitution instructing register 13 through the MMB I/F 11.

When it is switched from the upper address line to the branch address line branched off from the failed address line, the memory capacity display register 15 calculates a remaining memory capacity, and displays the remaining memory capacity on the CPU and the management board. In other words, as depicted in (A) of FIG. 4, when it is switched from the input from the address line bit [6] to the input from the branch address line of the system address bus SA[0] to output the latter to the address line bit[6], the remaining memory capacity is calculated to be 64 bytes, and is displayed on the CPU and the management board (see (A) (5) of FIG. 4). For example, as depicted in (B) of FIG. 4, when it is switched from the input from the address line bit[6] to the input from the branch address line of the system address bus SA[0] to output the latter to the address line bit[6], and it is switched from the input from the system address bus SA[5] to the bit[5] to the input from the branch address line of the system address bus SA[3] to output the latter to the address line bit[5], the remaining memory capacity is calculated to be 32 bytes, and is displayed on the CPU and the management board (see (A)(5) of FIG. 4).

Figure 5:
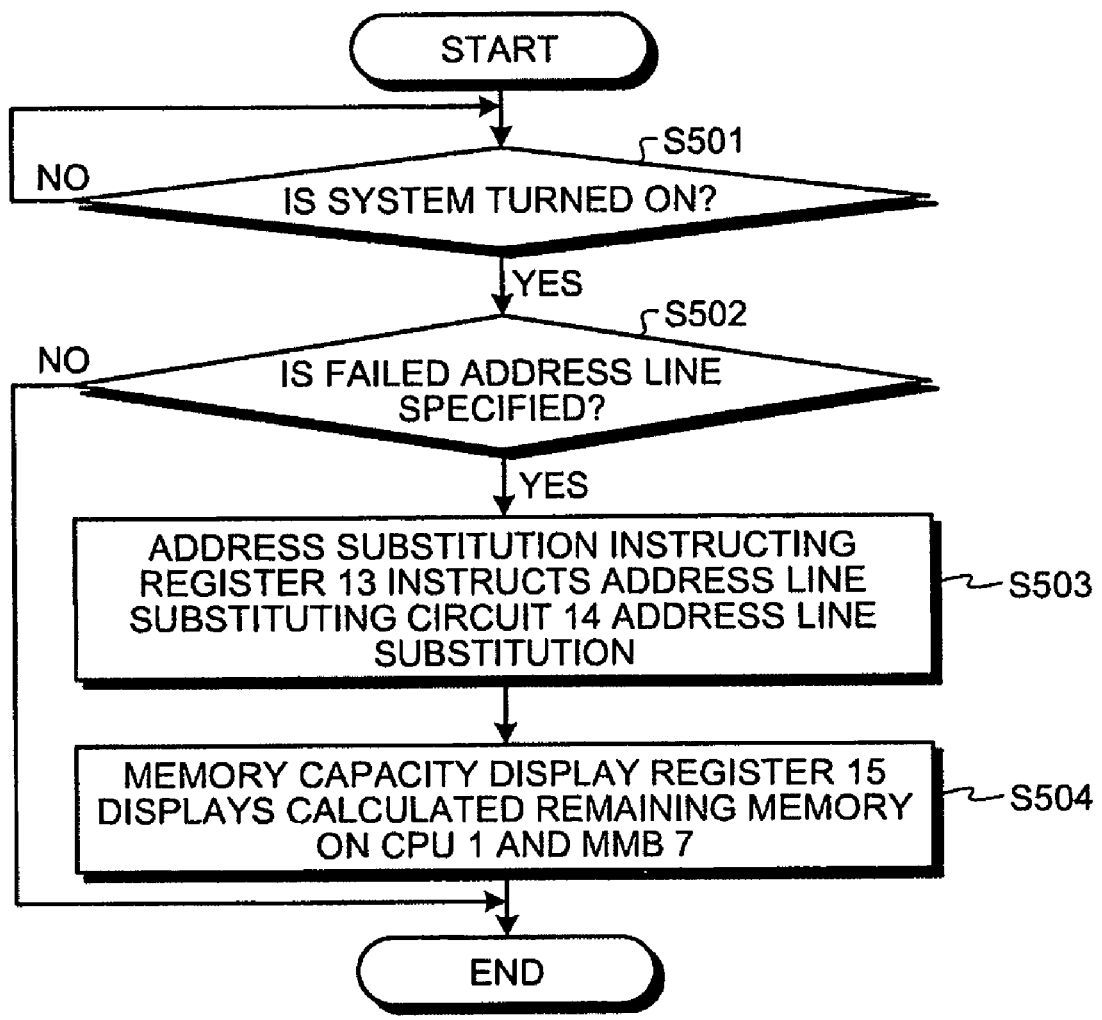
FIG. 5 is a figure for explaining a processing procedure of the address line failure handling apparatus according to the first embodiment.

Next, a processing of the address line failure handling apparatus 10 according to the first embodiment will be explained using FIG. 5. FIG. 5 is a figure for explaining the processing procedure of the address line failure handling apparatus according to the first embodiment.

First, when the computer system is turned on (Yes at Step S501), in the address line failure handling apparatus 10 according to the first embodiment, the failed address line specifying unit 71 installed in the MMB 7 examines an address line connected to the memory 6, and specifies a failed address line following the above-described processing depicted in FIG. 3, for example (Step S502). When a failed address line is not specified (No at Step S502), the processing ends.

On the other hand, when a failed address line is specified (Yes at Step S502), the address substitution instructing register 13 instructs the address line substituting circuit 14 to substitute the address line (Step S503). Specifically, because the failure of the address line bit[0] is specified in the case depicted in (A) of FIG. 4, the address line substituting circuit 14 is instructed to switch from the input from the address line bit[6] to the input from the branch address line of the system address bus SA[0] to output the latter to the address line bit[6].

The memory capacity display register 15 displays a calculated remaining capacity on the CPU 1 and the MMB 7 (Step S504), and ends the processing. In other words, as depicted in (A) of FIG. 4, when it is switched from the input from the address line bit[6] to the input from the branch address line of the system address bus SA[0] to output the latter to the address line bit[6], the remaining memory capacity is calculated to be 64 bytes, and is displayed on the CPU and the management board.

As illustrated above, according to the first embodiment, an address line connected to each bit is examined, and a failed address line is specified. Branch address lines branched off from lower address lines connected to lower bits of the memory 6 are connected to upper address lines connected to upper bits other than the lower bits. An input from an upper address line and an input from a branch address line are switched, and when a failed address line is specified, it is switched from an upper address line to the branch address line branched off from the failed address line, sacrificing the upper address line and substituting the upper address line with the lower address line. Therefore, use of the memory can be continued, and it is possible to avoid a significant decrease of a memory capacity due to memory degeneration even when a failure occurs in an address line of a memory.

According to the first embodiment, when it is switched from the upper address line to the branch address line branched off from the failed address line, the remaining memory capacity is calculated and is displayed on the CPU and the management board. Therefore, the CPU and the management board can detect the remaining capacity after the address line substitution, and can determine the system configuration after reactivation or the like (for example, whether it is possible to reactivate the system with the remaining memory capacity).

Because the failed address line specifying unit 71 included in the MMB 7 specifies a failed address line according to the first embodiment, specifying the failed address line can be realized with a firmware, and it becomes possible to avoid installing a complicate circuit, as compared with an approach of specifying the failed address line within the memory controller 5.

[b] Second Embodiment

Although in the first embodiment described above, the MMB 7 includes the failed address line specifying unit 71, the memory controller 5 includes the failed address line specifying unit 71 in a second embodiment.

Figure 6:
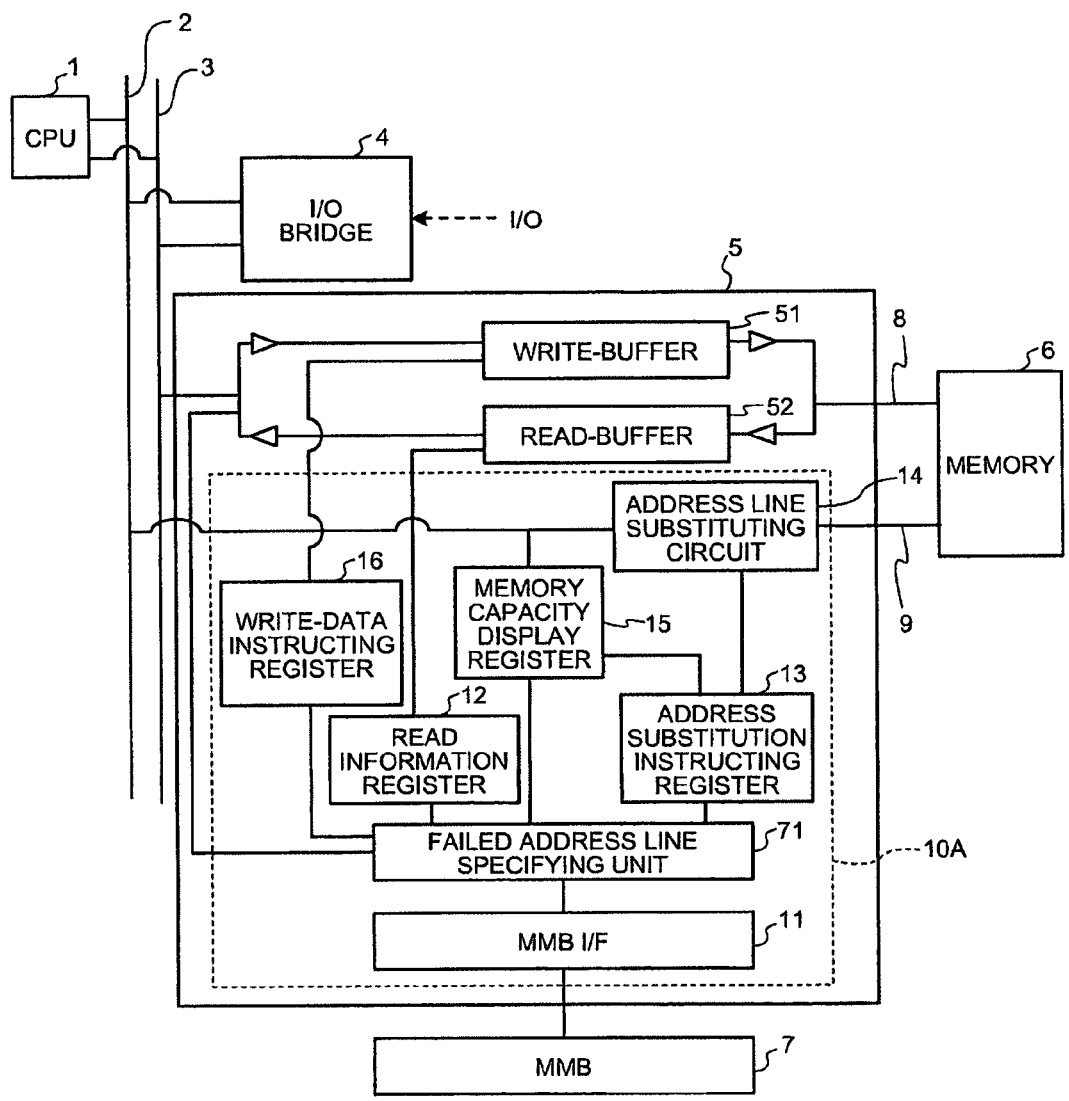
FIG. 6 is a block diagram for illustrating a configuration of the address line failure handling apparatus according to a second embodiment.

First of all, an address line failure handling apparatus according to the second embodiment will be explained using FIG. 6. FIG. 6 is a block diagram for illustrating a configuration of the address line failure handling apparatus according to the second embodiment.

The address line failure handling apparatus 10A according to the second embodiment has the same configuration as that of the address line failure handling apparatus 10 according to the first embodiment depicted in FIG. 2, but is different in that not the MMB 7, but the memory controller 5 includes the failed address line specifying unit 71. This difference will be mainly explained.

In the second embodiment, when the computer system is turned on, the failed address line specifying unit 71 receives an order to "examine an address line connected to the memory 6, and specify a failed address line" from the MMB 7 through the MMB I/F 11 in the memory controller 5, and examines an address line connected to the memory 6, and specifies a failed address line following the above-described processing depicted in FIG. 3. The failed address line specifying unit 71 according to the second embodiment receives, not through the MMB I/F 11, write-data stored in the write-data instructing register 16 through the write-buffer 51, and read-data stored in the read information register 12 through the read-buffer 52, and specifies a failed address line.

The failed address line specifying unit 71 instructs the address substitution instructing register 13 to switch the specified failed address line not through the MMB I/F 11. Specifically, because a failure of the address line bit [0] is specified in the case of (A) of FIG. 4, the address substitution instructing register 13 is instructed to switch from the input from the address line bit[6] to the input from the branch address line of the system address bus SA[0] to output the latter to the address line bit[6].

As illustrated above, because a failed address line is specified within the memory controller 5 according to the second embodiment, specifying the failed address line can be performed on a hardware, and it becomes possible to shorten the time required for specifying the failed address line as compared with an approach of specifying the failed address line within the MMB 7.

[c] Third Embodiment

Although the address line failure handling apparatus according to the first embodiment and the second embodiment has been explained, the present invention may be implemented in various different modes other than the above-described embodiments. Various different modes of embodiments are described in items [c-1] to [c-7] below as an address line failure handling apparatus according to a third embodiment.

[c-1] Examination of Failed Address Line

Although in the first embodiment and the second embodiment, examination of a failed address line is performed when the computer system is turned on, the present invention is not limited thereto. Examination of a failed address line may be performed every certain period of time (for example, every one hour) while the computer system is operating.

[c-2] Memory Number

Although in the first embodiment and the second embodiment, the computer system includes one memory, the present invention is not limited thereto. The computer system may include a plurality of memories, and in the computer system, the address line substituting circuit 14 may be installed in the memory controller for each memory. When an address line for each memory is examined, and a failed address line is specified, the failure may be handled by an address line substituting circuit corresponding to the failed address line.

[c-3] Remaining Memory Capacity

Although in the first embodiment and the second embodiment, the memory capacity halves as a result of handling a failure of a single address line, the memory capacity becomes a quarter when a failure of a single address line is handled, for example, in a DIMM (Dual In-line Memory Module) because a single address line shares a row address and a column address.

[c-4] Address Line Substituting Circuit

Although in the first embodiment and the second embodiment, an address line branches off to two upper address lines connected to the address line substituting circuit 14, the present invention is not limited thereto. Because two address lines rarely fail simultaneously usually, an address line branches may branch off to a single upper address line, and in other cases an address line may branch off to three or more upper address lines determined based on a full capacity of a memory installed on the computer system.

[c-5] MMB

Although in the second embodiment, an order to "examine an address line connected to the memory 6, and specify a failed address line" is received through the MMB I/F 11 in the memory controller 5 from the MMB 7 when a power is turned on, the order from the MMB 7 may be simply a signal of 1 bit indicating that the power is stable after the power is turned on. Alternatively, a reset signal generally input into a LSI may be used. At this time, a device corresponding to the MMB 7 may be realized with a hardware called a power monitoring circuit or a reset circuit.

[c-6] System Configuration etc.

All or some of the processing explained to be automatically performed in the present embodiment may be manually performed. For example, examination of a failed address line may be requested by a user through a keyboard or a touch panel. In addition, the processing procedure illustrated in the description or the drawings (for example, the order of examining an address line depicted in FIG. 3), the control procedure, the specific names, and the information including various data and parameters may be optionally modified unless otherwise specified.

The constitutional elements of each device depicted in the figures are functionally conceptual, and it is not necessarily required that the constitutional elements be configured physically as depicted in the figures. In other words, specific modes of distribution/integration of each component are not limited to those illustrated in the figure (for example, the mode in FIG. 2), and the components may be configured by distributing or integrating functionally or physically all or a part of the components in an optional unit according to various loads or usage. Furthermore, all or some of the processing functions performed in each unit may be realized by a CPU and a program analyzed and executed by the CPU, or alternatively may be realized as a hardware by a wired logic.

[c-7] Failed Address Line Handling Program

Although in the first embodiment and the second embodiment, various processing are realized by a hardware logic, the present invention is not limited thereto. A previously prepared program may be executed on a computer. An example of a computer (MMB) that executes an address line failure handling program that has functions same as those of the address line failure handling apparatus 10 illustrated in the first embodiment will be explained using FIG. 7. FIG. 7 is a figure for illustrating a computer that executes the address line failure program according to the first embodiment.

As depicted in FIG. 7, a computer 700 as an information processing device is configured by connecting by a bus 770 or the like a keyboard 710, a display 720, a CPU 730, a ROM 740, a HDD 750, and a RAM 760, and is connected to a computer system configured with the CPU 1, the I/O bridge 4, the memory controller 5, the memory 6, the system address bus 2, the system data bus 3, the memory data bus 8, and the memory address bus 9.

The ROM 740 stores therein in advance an address line failure handling program that exhibits functions same as those of the address line failure handling apparatus 10 illustrated in the first embodiment. Specifically, the ROM 740 stores, as depicted in FIG. 7, a failed address line specifying program 741, an address substitution instructing program 742, and a memory capacity display program 743. The programs 741 to 743 may be appropriately integrated or distributed similarly to the constitutional elements of the address line failure handling apparatus 10 depicted in FIG. 2.

By the CPU 730 reading out and executing the programs 741 to 743 from the ROM 740, as depicted in FIG. 7, the programs 741 to 743 function as a failed address line specifying process 731, an address substitution instruction process 732, and a memory capacity display process 733. The processes 731 to 733 correspond respectively to the failed address line specifying unit 71, the address substitution instructing register 13, and the memory capacity display register 15 depicted in FIG. 2.

The HDD 750 is provided with read/write information data 751, address line substitution instructing data 752, and memory capacity data 753 as depicted in FIG. 7. The read/write information data 751 corresponds to the read information register 12, and the write-data instructing register 16 used in FIG. 2, the address line substitution instructing data 752 corresponds to the address line substitution instruction stored in the address substitution instructing register 13, and the memory capacity data 753 corresponds to the stored remaining memory capacity. The CPU 730 registers read/write information data 761 in the read/write information data 751, registers address line substitution instructing data 762 in the address line substitution instructing data 752, registers memory capacity data 763 in the memory capacity data 753, and executes address line failure handling based on the read/write information data 761, the address line substitution instructing data 762, and the memory capacity data 763.

The programs 741 to 743 need not necessarily be stored in the ROM 740 from the beginning, but may be stored, for example, in a "portable physical media" such as a flexible disk (FD), a CD-ROM, a MO disk, a DVD disk, a magnet optical disk, and an IC card inserted into the computer 700, a "fixed physical media" such as a HDD provided inside or outside the computer 700, or "another computer (or server)" connected to the computer 700 through a public line, the Internet, a LAN, a WAN, or the like, and the computer 700 may read out the programs from them, and execute the programs.

According to one embodiment, it becomes possible to continue to use a memory by sacrificing an upper address line and substituting the upper address line with a lower address line, and to avoid a significant decrease in memory capacity due to memory degeneration even when a failure occurs in a memory address line.

According to one embodiment, it becomes possible to specify a failed address line on a hardware because the failed address line is specified in a memory controller connected to a memory through an address line, and to shorten the time required for specifying a failed address line as compared with an approach of specifying a failed address line outside the memory controller (for example, within a management board).

According to one embodiment, it becomes possible to specify a failed address line with a firmware because a memory controller controlling device that controls a memory controller specifies the failed address line, and to avoid mounting a complicate circuit as compared with an approach of specifying a failed address line within a memory controller.

According to an embodiment, it becomes possible for a CPU and a management board to detect memory capacity after address line substitution because a remaining memory capacity is calculated and is displayed on the CPU and the management board when an upper address line is substituted with a branch address line branched off from a failed address line, and to determine a system configuration or the like after reactivation (for example, whether the system can be reactivated with the remaining memory capacity).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An apparatus for handling a failure of an address line from among memory address lines connected from the apparatus to a memory, each of the memory address lines representing a bit, and the apparatus receiving a system address from a processor via system address lines connected from the processor and the apparatus, the apparatus comprising:

a failed address line specifying unit that examines the memory address lines and specifies a failed address line;

an address line substituting unit that switches between an input from an upper address line connected to an upper bit of the system address lines and an input from a branch address line branched off from a lower address line connected to a lower bit of the system address lines other than the upper bit, outputs either of the inputs to an upper bit of the memory address lines, and outputs the input from the upper address line when the failed address line specifying unit does not specify a failed address line, the upper bit of the memory address lines corresponding to the upper bit of the system address lines; and an address line substitution instructing unit that instructs the address line substituting unit to output the input from the branch address line branched off from the lower address line when the failed address line specifying unit specifies a memory address line corresponding to the lower address line, as the failed address line.

2. The apparatus according to claim 1, wherein the failed address line specifying unit resides in a memory controller connected to the memory through the memory address lines.

3. The apparatus according to claim 1, wherein the failed address line specifying unit resides in a controlling device that controls a memory controller that is connected to the memory through the memory address lines, provides an interface between a processor and the memory, and partially includes the apparatus.

4. The apparatus according to claim 1, further comprising a remaining memory capacity display unit that calculates a remaining memory capacity and displays the memory capacity on a CPU and a management board when the address line substitution instructing unit switches from the upper address line to the branch address line branched off from the failed address line.

5. A method for handling a failure of an address line from among memory address lines connected from an apparatus to a memory, each of the memory address lines representing a bit, and the apparatus receiving a system address from a processor via system address lines connected from the processor to the apparatus, the method comprising:
    specifying a failed address line by examining the memory address lines; and
    instructing to stop a use of an upper bit of the system address lines and output an input from a branch address line branched off from a lower address line connected to a lower bit of the system address lines other than the upper bit, to an upper bit of the memory address lines when a memory address line corresponding to the lower address line is specified as the failed address line in the specifying, the upper bit of the memory address lines corresponding to the upper bit of the system address lines.

6. A computer readable storage medium containing instructions for handling a failure of an address line from among memory address lines connected from an apparatus to a memory, each of the memory address lines representing a bit, and the apparatus receiving a system address from a processor via system address lines connected from the processor to the apparatus, the instructions, when executed by a computer, causing the computer to perform:
    specifying a failed address line by examining the memory address lines; and
    instructing to stop a use of an upper bit of the system address lines and output an input from a branch address line branched off from a lower address line connected to a lower bit of the system address lines other than the upper bit, to an upper bit of the memory address lines when a memory address line corresponding to the lower address line is specified as the failed address line in the specifying, the upper bit of the memory address lines corresponding to the upper bit of the system address lines.

7. An information processing device comprising
    a processor,
    a memory, and
    a memory controller that is connected to the processor through system address lines, connected to the memory through memory address lines, and controls access processing of the memory,
    the memory controller including:
    a failed address line specifying unit that examines the memory address lines, and specifies a failed address line in which failure occurs;
    an address line switching unit that switches between an input from an upper address line of the system address lines and an input from a branch address line branched off from a lower address line of the system address lines, outputs either of the inputs to an upper address line of the memory address lines, and outputs the input from the upper address line of the system address lines when the failed address line specifying unit does not specify a failed address line, the upper address line of the memory address lines corresponding to the upper address line of the system address lines; and
    an instructing unit that instructs the address line switching unit to output the input from the branch address line branched off from the lower address line when the failed address line specifying unit specifies a memory address line corresponding to the lower address line as the failed address line.

8. A memory controller that is connected between a processing unit and a memory, and controls read/write of the memory by receiving a system address from the processing unit through system address lines, and outputting a memory address to the memory through memory address lines, the memory controller comprising:
    a detecting unit that detects whether a failure has occurred in the memory address lines;
    a selecting unit that outputs either of an upper system address of the system address lines and a lower system address of the system address lines to an upper memory address line of the memory address lines and outputs the upper system address of the system address lines when the detecting unit does not detect that a failure has occurred in the memory address lines; and
    a unit that, when the detecting unit detects a failure occurrence in a lower memory address line, switches the upper system address supplied to the upper memory address line to the lower system address corresponding to the lower memory address line in which the failure occurrence has been detected.

* * * * *